US012056596B2

(12) United States Patent
Nikonov et al.

(10) Patent No.: US 12,056,596 B2
(45) Date of Patent: Aug. 6, 2024

(54) STAGED OSCILLATORS FOR NEURAL COMPUTING

(71) Applicant: Intel Corporation, Santa Clara, CA (US)

(72) Inventors: Dmitri E. Nikonov, Beaverton, OR (US); Hai Li, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 849 days.

(21) Appl. No.: 16/989,371

(22) Filed: Aug. 10, 2020

(65) Prior Publication Data

US 2020/0372333 A1 Nov. 26, 2020

(51) Int. Cl.
*G06N 3/063* (2023.01)
*H03K 3/03* (2006.01)

(52) U.S. Cl.
CPC ........... *G06N 3/063* (2013.01); *H03K 3/0315* (2013.01)

(58) Field of Classification Search
CPC ....... G06N 3/063; G06N 3/065; H03K 3/0315
USPC ............................................................ 331/2
See application file for complete search history.

(56) References Cited

U.S. PATENT DOCUMENTS

| 2007/0120588 A1* | 5/2007 | Lim ........................... G06F 1/10 327/291 |
| 2014/0092664 A1* | 4/2014 | Bourianoff ........... G11C 15/046 365/45 |
| 2018/0013439 A1* | 1/2018 | Pilly ........................ H03D 7/14 |

OTHER PUBLICATIONS

Tadashi Shibata et al.; Title: "CMOS Supporting Circuitries for Nano-Oscillator-Based Associative Memories"; Date of conference: Aug. 29-31, 2012; Date Added to IEEE Xplore: Oct. 18, 2012; Publisher: IEEE.*
Romera, Miguel, et al., "Vowel Recognition with Four Coupled Spin-Torque Nano-oscillators," Nature, vol. 563, Nov. 8, 2018; 13 pages.

* cited by examiner

*Primary Examiner* — Richard Tan
(74) *Attorney, Agent, or Firm* — Akona IP PC

(57) ABSTRACT

Disclosed herein are staged oscillators for neural computing, as well as related methods and assemblies. In some embodiments, neural computing circuitry may include a first oscillator set, a second oscillator set, and an averaging structure coupled between the first oscillator set and the second oscillator set.

20 Claims, 6 Drawing Sheets

STAGED OSCILLATORS FOR NEURAL COMPUTING

BACKGROUND

Neural networks are a computational approach based on a collection of neural computing units that loosely model the way the brain solves problems. Such systems may be self-learning and trained rather than explicitly programmed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
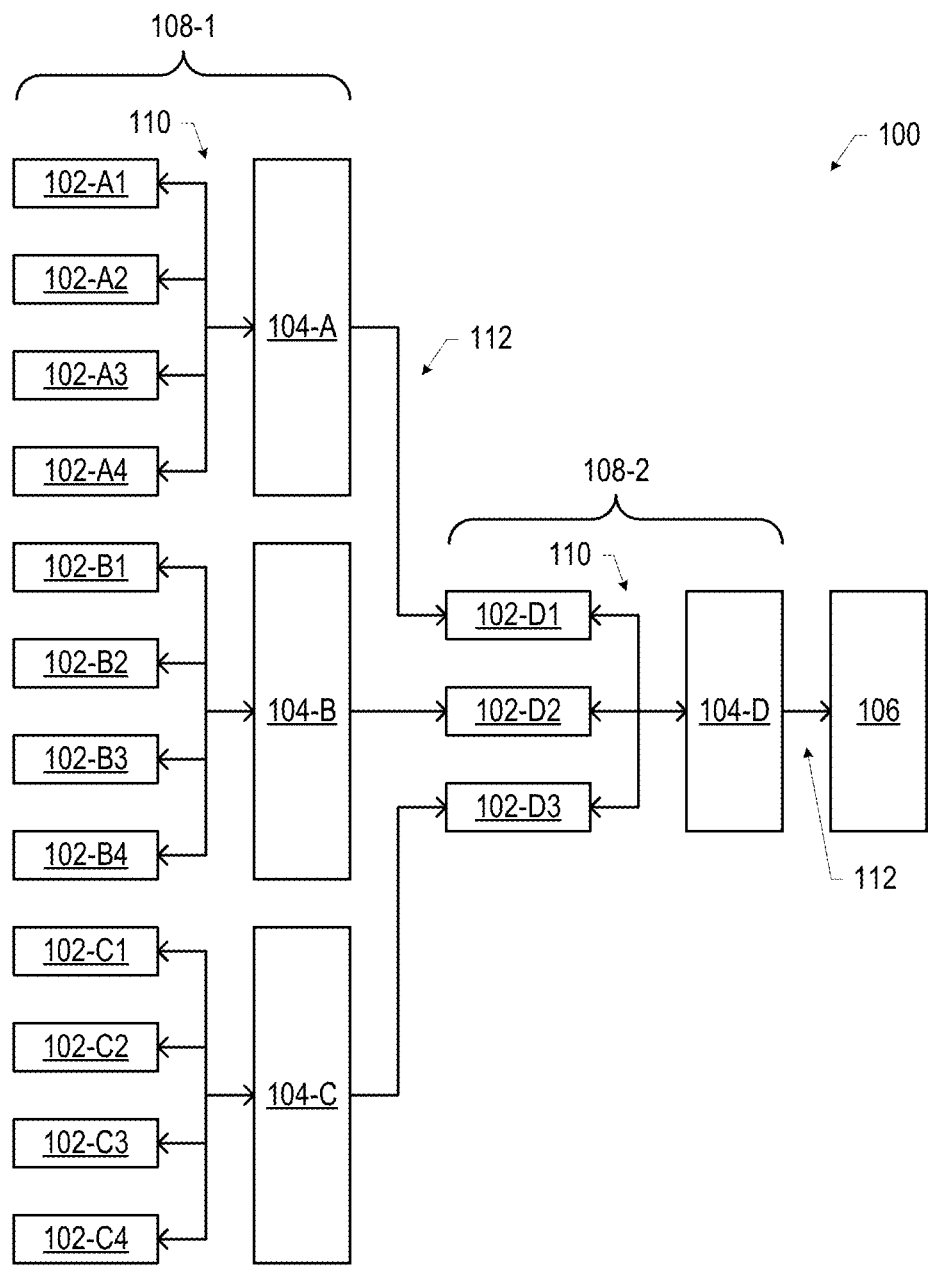
FIGS. 1 and 2 are block diagrams of example arrangements of staged oscillator circuitry for neural computing, in accordance with various embodiments.

Disclosed herein are staged oscillators for neural computing, as well as related methods and assemblies. In some embodiments, neural computing circuitry may include a first oscillator set, a second oscillator set, and an averaging structure coupled between the first oscillator set and the second oscillator set.

Some artificial intelligence structures (e.g., those designed for pattern recognition or associative memory applications) may include multiple oscillators coupled to a common node. For example, in pattern recognition applications, an input may be applied as driving signals to an array of oscillators that have been trained on a target pattern, and the degree of synchronization among the oscillators may represent the degree of match (DOM) (e.g., the absence or presence of recognition) between the input and the target pattern. Conventional approaches to building such structures have been limited due to the difficulty of coupling together more than a small number of individually controlled oscillators. Further, conventional approaches to coupling oscillators often involve the use of long interconnects between components, which may result in high power consumption and/or excessive latency.

The staged oscillator circuitry disclosed herein may have a number of advantages relative to conventional approaches in which all of the oscillators are coupled to a single averager. For example, the staged oscillator circuitry disclosed herein may achieve lower latency, shorter interconnects, and may enable more oscillators to be coupled together relative to conventional approaches. The staged oscillator circuitry disclosed herein may enable many thousands of oscillators to be coupled for neural computing purposes, a far greater number than can be achieved using conventional approaches. In some embodiments, the power consumption of the staged oscillator circuitry disclosed herein may scale with the number of oscillators (not exponentially, as occurs in some conventional approaches) and latency may be proportional to a logarithm of the number of oscillators (substantially less than incurred in conventional approaches).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 5" may be used to refer to the collection of drawings of FIGS. 5A-5C.

Figure 2:
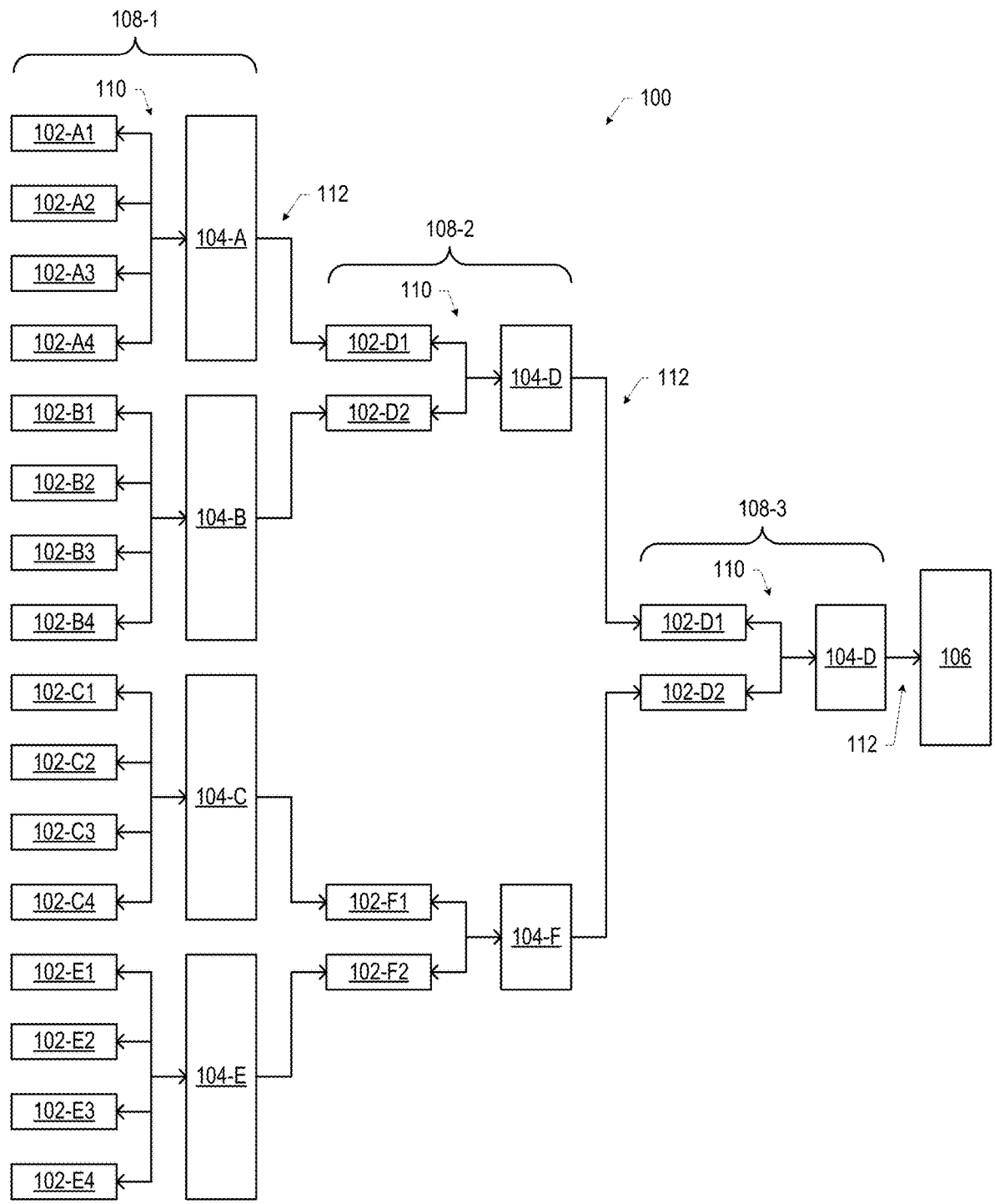

FIG. 1 is a block diagram of an example arrangement of staged oscillator circuitry 100, in accordance with various embodiments. The staged oscillator circuitry 100 of FIG. 1 may include a first oscillator stage 108-1 and a second oscillator stage 108-2. Although two oscillator stages 108 are depicted in the staged oscillator circuitry 100 of FIG. 1, this is simply for ease of illustration, and staged oscillator circuitry 100 may include any desired number of stages (e.g., three oscillator stages 108, as depicted in FIG. 2, or more than three oscillator stages 108).

An individual oscillator stage 108 may include one or more averaging structures 104, and multiple oscillators 102 coupled to an individual averaging structure 104. For example, in FIG. 1, the first oscillator stage 108-1 includes three averaging structures 104 (labeled 104-A, 104-B, and 104-C), and each averaging structure 104 is coupled to multiple oscillators 102 (i.e., oscillators 102-A1, 102-A2, 102-A3, and 102-A4 are coupled to the averaging structure 104-A, etc.). Although FIG. 1 and others of the accompanying drawings depict multiple averaging structures 104 in an oscillator stage 108 each being coupled to the same number of oscillators 102, this is simply an example, and different averaging structures 104 in an oscillator stage 108 may be coupled to the same number or different numbers of oscillators 102. Some oscillator stages 108 may include only a single averaging structure 104; for example, in the embodiment of FIG. 1, the second oscillator stage 108-2 includes one averaging structure 104 (labeled 104-D) and this averaging structure 104 is coupled to multiple oscillators 102 (i.e., oscillators 102-D1, 102-D2, and 102-D3). Although FIG. 1 and others of the accompanying drawings depict the averaging structures 104 in different oscillator stages 108 as being coupled to different numbers of oscillators 102, this is simply an example, and different averaging structures 104 in different oscillator stages 108 may be coupled to the same number or different numbers of oscillators 102.

In an individual stage 108, an averaging structure 104 may be coupled to its associated oscillators 102 by intra-stage interconnects 110. In some embodiments, intra-stage interconnects 110 may be bidirectional interconnects, meaning that the signal propagates from the oscillators 102 to their associated averaging structure 104 and vice versa. In some embodiments, a bidirectional intra-stage interconnect 110 includes a capacitor connected by conductive wires to a node within an associated oscillator 102 and to the associated averaging structure 104. Different oscillator stages 108 may be coupled together by inter-stage interconnects 112. In particular, the inter-stage interconnects 112 may couple the output of the averaging structures 104 of a preceding stage 108 with the inputs of the oscillators 102 in a subsequent stage 108. For example, as shown in FIG. 1, the outputs of the averaging structures 104-A, 104-B, and 104-C of the first oscillator stage 108-1 may be coupled to the inputs of the oscillators 102-D1, 102-D2, and 102-D3 of the second oscillator stage 108-2. In some embodiments, the number of averaging structures 104 included in a preceding oscillator stage 108 may be equal to the number of oscillators 102 in the subsequent oscillator stage 108. In some embodiments, the inter-stage interconnects 112 may be unidirectional interconnects, meaning that the signal propagates in one direction: from the averaging structure 104 in a preceding oscillator stage 108 to the oscillators 102 in a subsequent oscillator stage 108. In some embodiments, a unidirectional inter-stage interconnect 112 may include a conducting wire between the averaging structure 104 and the gate of a NAND gate.

Staged oscillator circuitry 100 may also include peak detector circuitry 106. In an embodiment, the output of the peak detector 106 represents the time-dependent amplitude of the waveform at averaging structure 104. The peak detector circuitry 106 may be coupled to the output of the "last" oscillator stage 108 in the staged oscillator circuitry 100 by an inter-stage interconnect 112 (e.g., a unidirectional interconnect). In some embodiments, the "last" oscillator stage 108 in the staged oscillator circuitry 100 may have a single averaging structure 104 whose output is coupled to the peak detector circuitry 106; FIG. 1 illustrates an embodiment of such staged oscillator circuitry 100 having two oscillator stages 108, while FIG. 2 illustrates an embodiment of such staged oscillator circuitry 100 having three oscillator stages 108. In some embodiments, staged oscillator circuitry 100 may include only a single peak detector circuitry 106, coupled to the output of the "last" oscillator stage 108, and the outputs of preceding oscillator stages 108 may feed into this "last" oscillator stage 108.

As noted above, staged oscillator circuitry 100 may include any desired number of oscillator stages 108, and an oscillator stage 108 may include any desired number of averaging structures 104 coupled to any desired number of oscillators 102. For example, FIG. 2 is a block diagram of an example arrangement of staged oscillator circuitry 100 including three oscillator stages 108. The elements of the staged oscillator circuitry 100 of FIG. 2 may take the form of any of the embodiments of these elements discussed herein (e.g., discussed above with reference to FIG. 1). In contrast to the embodiment of FIG. 1 (in which the second oscillator stage 108-2 includes a single averaging structure 104), the staged oscillator circuitry 100 of FIG. 2 has a second oscillator stage 108-2 including two averaging structures 104 (labeled 104-D and 104-F). Thus, instead of having the outputs of the first oscillator stage 108-1 feeding into a second oscillator stage 108-2 having oscillators 102 coupled to a single averaging structure 104, FIG. 2 illustrates an embodiment in which the outputs of the first oscillator stage 108-1 feed into a second oscillator stage 108-2 having oscillators 102 coupled to different averaging structures 104. Although these various embodiments are discussed with reference to a "first" oscillator stage 108-1 and a "second" oscillator stage 108-2, these arrangements may be applied to any adjacent oscillator stages 108 in staged oscillator circuitry 100.

In pattern recognition or associative memory applications, during operation of the staged oscillator circuitry 100, element-by-element differences of the input and trained patterns are used to drive the oscillators 102; if the oscillators 102 synchronize, then a high DOM is detected and the pattern is recognized. The behavior of the oscillators 102 coupled to a particular averaging structure 104 may cause the averaging structure 104 to oscillate with a frequency that is near the average of the frequencies of the oscillators 102, with an amplitude proportional to the DOM; the signals from multiple averaging structures 104 in an oscillator stage 108 may 'injection lock' oscillators 102 in the next oscillator stage 108, or in other words, the initial frequency of an oscillator 102-D is determined by the average frequency of the signal at the averaging structure 104-A. These oscillators 102-D may then synchronize using their own averaging structure 104-D. This may continue through all of the oscillator stages 108, and the amplitude of the DOM at the averaging structure 104 of the last oscillator stage 108 may be detected by the peak detector circuitry 106, yielding an overall DOM that can be used as a pattern recognition/associative memory result.

Figure 3A:
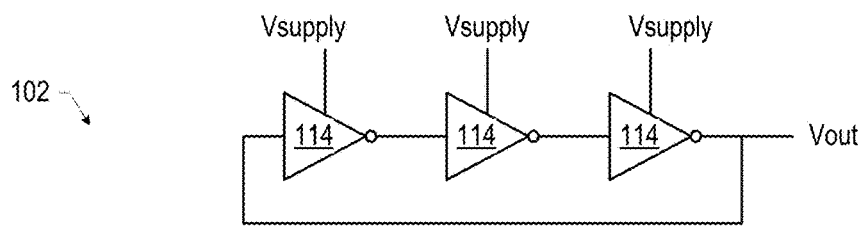
FIGS. 3A and 3B are block diagrams of example ring oscillators that may be included in the staged oscillator circuitry disclosed herein, in accordance with various embodiments.
Figure 3B:
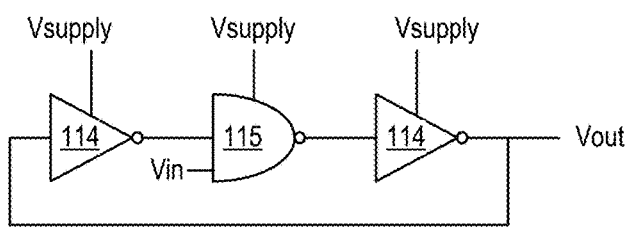

The elements of staged oscillator circuitry 100 may take any suitable form. For example, in some embodiments, an oscillator 102 may include a ring oscillator. FIG. 3A is a block diagram of a ring oscillator that may be used in an oscillator 102 of staged oscillator circuitry 100. The ring oscillator of FIG. 3A may include an odd number of NOT gates 114 (which may itself include multiple transistors, and may include one or more resistors, as known in the art); although three NOT gates 114 are illustrated in FIG. 3A, a ring oscillator may include more than three NOT gates 114 (e.g., five NOT gates 114 or seven NOT gates 114). A NOT gate 114 in a ring oscillator may be provided with a supply voltage (Vsupply), and the ring oscillator may provide a voltage output (Vout) which may, for example, be coupled to an input of an averaging structure 104 in an oscillator stage 108. FIG. 3B is a block diagram of another ring oscillator that may be used in an oscillator 102 of staged oscillator circuitry 100. The ring oscillator of FIG. 3B may have many features in common with the ring oscillator of FIG. 3B, but at least one of the NOT gates 114 is replaced by a NAND gate 115; one of the inputs to the NAND gate 115 may be a voltage (Vin) provided by an inter-stage interconnect 112. In some embodiments, an averaging structure 104 may include a metal plane (which may be, for example, an extended, planar version of any of the conductive lines 128 discussed below with reference to FIGS. 7-8). The peak detector circuitry 106 may include any suitable peak detector circuitry known in the art; for example, in some embodiments, the peak detector circuitry 106 may include a first source-follower stage and a second source-follower stage cascaded with the first follower stage. In some such embodiments, the peak detector circuitry 106 may include a digital-to-analog converter to generate a bias voltage, the value of which controls parameters of the source-followers.

Figure 4:
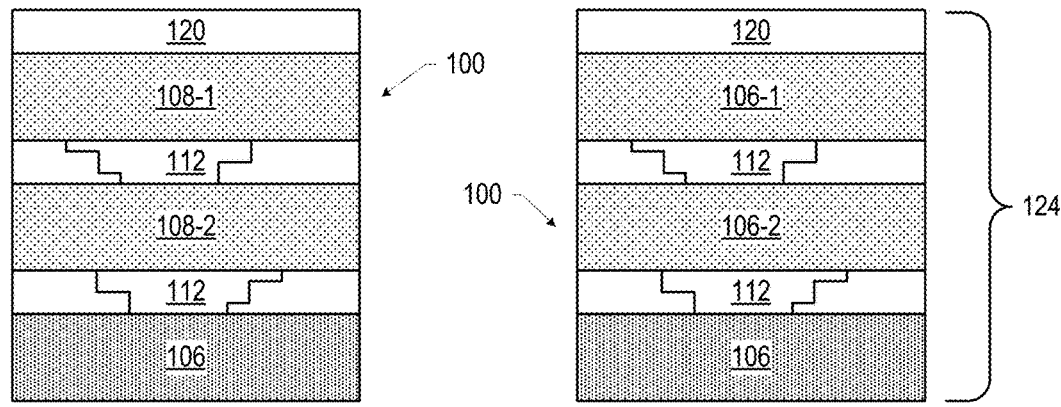
FIGS. 4 and 5A-5C are side, cross-sectional views of example arrangements of staged oscillator circuitry in neural computing dies, in accordance with various embodiments.

Staged oscillator circuitry 100 may be included in any of a number of components in any of a number of ways. In some embodiments, all of the staged oscillator circuitry 100 may be included in a single neural computing die; while in other embodiments, different portions of the staged oscillator circuitry 100 may be distributed across different neural computing dies. In other embodiments, different ones of the oscillator stages 108 may be non-coplanar; for example, different oscillator stages 108 may be arranged vertically with respect to each other in one or more circuit layers. For example, FIG. 4 is a side, cross-sectional view of an example neural computing die 150 with staged oscillator circuitry 100, in accordance with various embodiments. In some embodiments, a neural computing die 150 with staged oscillator circuitry 100 may be referred to as a neural accelerator chip, or a neural accelerator. A neural computing die 150 may include multiple oscillator stages 108 having inter-stage interconnects 112 therebetween, arranged in a vertical stack (i.e., such that at least one conductive via is included in a conductive pathway, coupling adjacent oscillator stages 108, of inter-stage interconnects 112, as discussed further below with reference to FIGS. 7-9). The oscillator stages 108 of FIG. 4 may also include intra-stage interconnects 110, not shown. Inter-stage interconnects 112 may include such conductive pathways between the oscillator stages 108 on either side of the inter-stage interconnects 112. In some embodiments, inter-stage interconnects 112 may include conductive pathways between outputs of the averaging structures 104 of the "preceding" oscillator stage 108 and inputs of oscillators 102 of the "subsequent" oscillator stage 108. Thus, an oscillator stage 108-J providing inputs to the oscillator stage 108-K may be located "above" the oscillator stage 108-K (e.g., closer to the input region 120), and an oscillator stage 108-L accepting outputs from the oscillator stage 108-K may be located "below" the oscillator stage 108-K (e.g., farther from the input region 120). The embodiments of FIG. 4 depict two oscillator stages 108 in the staged oscillator circuitry 100 of a neural computing die 150, but this is simply for ease of illustration, and staged oscillator circuitry 100 of a neural computing die 150 may have more than two oscillator stages 108, as desired. Peak detector circuitry 106 may be located "below" the oscillator stages 108 (e.g., farthest from the input region 120).

As noted above, a neural computing die 150 may include an input region 120; in some embodiments, the input region 120 may include the outermost layer or layers of a neural computing die 150. For example, the input region 120 may include conductive contacts, such as conductive pads or pedestals, at a surface of the neural computing die 150, and may be configured for contact with an external device that provides an input to the oscillator stages 108 of the neural computing die 150 (e.g., an image capture device that will provide an input image to the staged oscillator circuitry 100 of the neural computing die 150). The input region 120 in such embodiments may include memory cells to store the image (e.g., one or more memory cells per pixel of an input image). In another example, the input region 120 may itself include an integrated device that provides an input to the oscillator stages 108 of the neural computing die 150 (e.g., an image capture device, such as a charge-coupled device (CCD)).

Figure 5A:
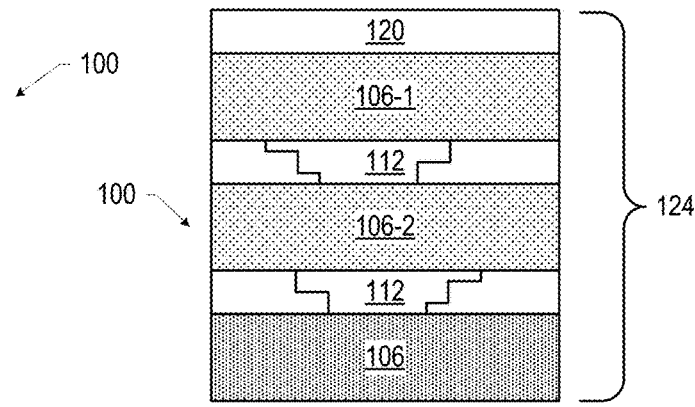
Figure 5B:
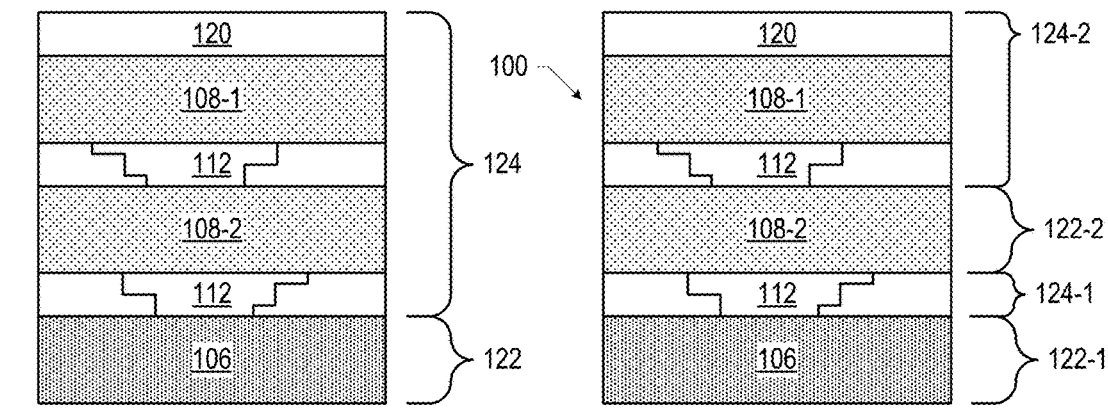
Figure 5C:
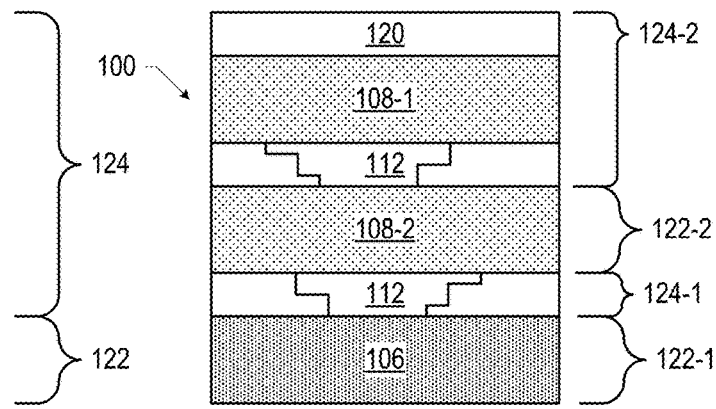

The oscillator stages 108 and peak detector circuitry 106 included in a neural computing die 150 may be distributed between the front-end region(s) and/or the back-end region(s) of a neural computing die 150 in any desired manner. FIGS. 5A-5C are side, cross-sectional views of example arrangements of staged oscillator circuitry 100 in a neural computing die 150, in accordance with various embodiments. For example, FIG. 5A illustrates an embodiment in which the input region 120, all of the oscillator stages 108, and the peak detector circuitry 106 are located in the back-end region 124 of a neural computing die 150, above a front-end region 122. As used herein, a "front-end region" may refer to a region formed as part of front-end fabrication operations, and may be a region in which devices (e.g., transistors) are built up on an underlying substrate material such as a semiconductor material or glass. A front-end region 122 may retain at least a portion of the underlying substrate material. Examples of layers that may be included in a front-end region 122 are discussed below with reference to FIG. 9. A "back-end region" may refer to a region formed as part of back-end fabrication operations, and may be a region including one or more layers of a metallization stack (e.g., layers of interconnects through an interlayer dielectric material). In some embodiments, a back-end region 124 may also include transistors (e.g., thin film transistors, as discussed below with reference to FIG. 8), or may not include transistors. Examples of layers that may be included in a back-end region 124 are discussed below with reference to FIGS. 7-8. In some examples of the embodiment of FIG. 5A, the front-end region 122 may include logic circuitry different from neural network circuitry. For example, the front-end region 122 may include output buffering circuitry, some portions of analog-to-digital conversion circuitry, or other circuitry. The oscillator stages 108 of FIG. 5 may also include intra-stage interconnects 110, not shown.

FIG. 5B illustrates an embodiment in which the input region 120 and some of the oscillator stages 108 are located in the back-end region 124 of a neural computing die 150, and the peak detector circuitry 106 (and more oscillator stages 108, not shown) is located in the front-end region 122. For example, in some embodiments, the peak detector circuitry 106 includes front-end transistors (e.g., as discussed below with reference to FIG. 9), the adjacent inter-stage interconnects 112 include the lowest layers in a metallization stack (e.g., M0, M1, etc., as discussed below.), and the oscillator stages 108-2 and 108-2 include back-end transistors (e.g., as discussed below with reference to FIG. 8). In the embodiment of FIG. 5B, the front-end region 122 may include peak detector circuitry 106, and also may include logic circuitry different from neural network circuitry; for example, the front-end region 122 may include output buffering circuitry, some portions of analog-to-digital conversion circuitry, or other circuitry.

FIG. 5C illustrates an embodiment with multiple alternating front-end regions 122 and back-end regions 124, with oscillator stages 108 and peak detector circuitry 106 distributed therein. Such an embodiment may be constructed using a wafer-to-wafer bonding technique, for example; a first wafer including the front-end region 122-1 and the back-end region 124-1 may be bonded to another wafer including the front-end region 122-2 and the back-end region 124-2 to form the neural computing die 150 of FIG. 5C. FIGS. 4-5 illustrates portions of example embodiments of neural computing die 150, and any neural computing die 150 may include other regions and features.

Figure 6:
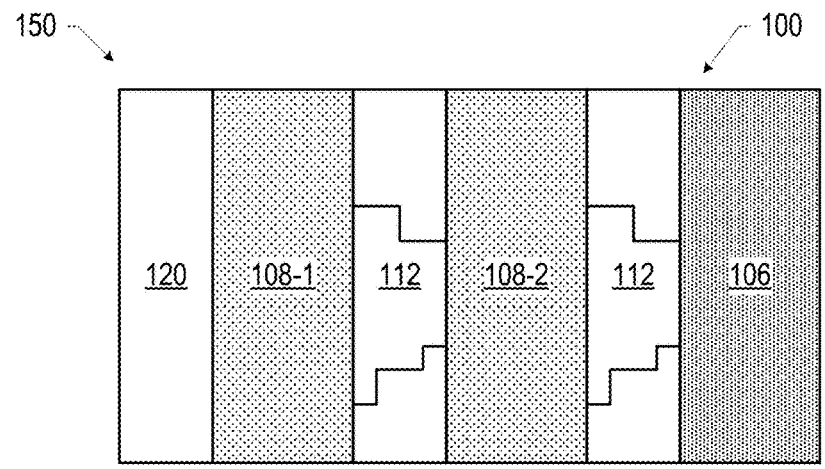
FIG. 6 is a top view of an example arrangement of staged oscillator circuitry in a neural computing die, in accordance with various embodiments.

In some embodiments, multiple oscillator stages 108 may be arranged in a coplanar manner (e.g., with different oscillator stages 108 arranged laterally with respect to each other in one or more circuit layers). FIG. 6 is a top view of an example neural computing die 150 having coplanar oscillator stages 108. As shown in FIG. 6, the peak detector circuitry 106 may be coplanar with the multiple oscillator stages 108, but in other embodiments, the peak detector circuitry 106 may be non-coplanar with the multiple oscillator stages 108.

Figure 7:
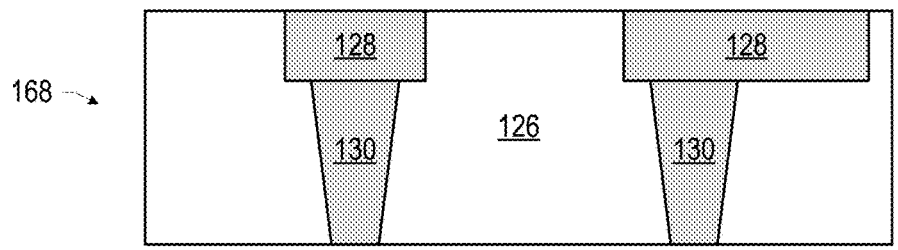
FIG. 7 is a side, cross-sectional view of an example interconnect layer that may be included in a neural computing die with staged oscillator circuitry, in accordance with various embodiments.

Staged oscillator circuitry 100 included in a neural computing die 150 may include one or more layers in a neural computing die 150. For example, FIG. 7 is a side, cross-sectional view of an example interconnect layer 168 that may be included in an oscillator stage 108, an inter-stage interconnect 112, and/or peak detector circuitry 106 of a neural computing die 150. The interconnect layer 168 may include one or more conductive lines 128 in conductive contact with one or more conductive vias 130. The particular number and arrangement of conductive lines 128 and conductive vias 130 in FIG. 7 is simply illustrative, and any suitable number and arrangement may be used. One or more interconnect layers 168 may form a metallization stack (also called an interlayer dielectric (ILD) stack) of the neural computing die 150.

The conductive lines 128 and conductive vias 130 may be arranged within an interconnect layer 168 to route electrical signals according to a wide variety of designs (in particular, the arrangement is not limited to the particular configuration of interconnect structures depicted in FIG. 7). Staged oscillator circuitry 100 may include any desired number of interconnect layers 168.

Figure 9:
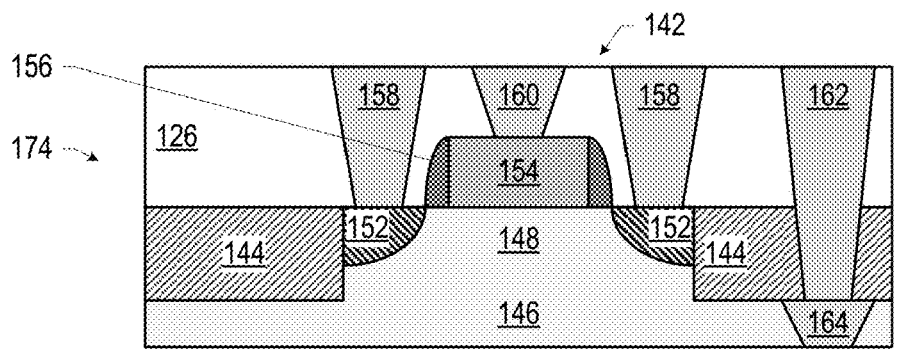
FIG. 9 is a side, cross-sectional view of an example front-end layer that may be included in a neural computing die with staged oscillator circuitry, in accordance with various embodiments.

The conductive lines 128 may be arranged to route electrical signals in a direction of a plane that is perpendicular to the vertical axis defining the stack of oscillator stages 108 (e.g., substantially parallel with a surface of the substrate 146 upon which the front-end layer 174 is formed, as illustrated in FIG. 9). For example, the conductive lines 128 may route electrical signals in a direction in and out of the page from the perspective of FIG. 7. The conductive vias 130 may be arranged to route electrical signals in a direction of a plane that is parallel to the vertical axis defining the stack of oscillator stages 108 (e.g., substantially perpendicular to the surface of the substrate 146 upon which the front-end layer 174 is formed, as illustrated in FIG. 9). In some embodiments, the conductive vias 130 may electrically couple conductive lines 128 of different interconnect layers 168 together. As noted above, the lateral dimensions of a conductive line 128 may be expanded to form a conductive plane, which may serve as an averaging structure 104 in some embodiments.

The interconnect layers 168 may include an insulating material 126 disposed between the interconnect structures, as shown in FIG. 7. In some embodiments, the insulating material 126 disposed between the interconnect structures in different ones of the interconnect layers 168 may have different compositions; in other embodiments, the composition of the insulating material 126 in different interconnect layers 168 may be the same. The insulating material 126 may be a dielectric material, such as silicon dioxide. In some embodiments, the insulating material 126 may be any suitable interlayer dielectric (ILD) material.

When an interconnect layer 168 is formed directly on a front-end layer 174 (FIG. 9), that interconnect layer 168 may be referred to as Metal 1 or M1. Further interconnect layers 168 formed on that interconnect layer 168 may be referred to as Metal 2 (M2), Metal 3 (M3), etc. Although the conductive lines 128 and the conductive vias 130 are structurally delineated with a line within the interconnect layer 168 and others of the accompanying drawings for the sake of clarity, the conductive lines 128 and the conductive vias 130 may be structurally and/or materially contiguous (e.g., simultaneously filled during a dual-damascene process) in some embodiments.

Figure 8:
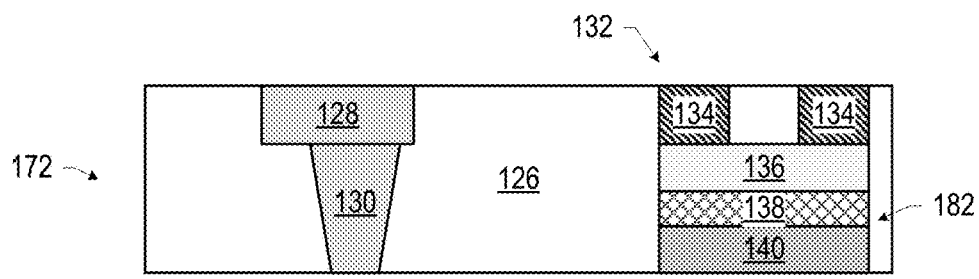
FIG. 8 is a side, cross-sectional view of an example back-end layer that may be included in neural computing die with staged oscillator circuitry, in accordance with various embodiments.

FIG. 8 is a side, cross-sectional view of an example back-end layer 172 that may be included in an oscillator stage 108, an inter-stage interconnect 112, and/or peak detector circuitry 106 of a neural computing die 150. A back-end layer 172 may include any of the interconnect structures discussed above with reference to FIG. 7 (e.g., including conductive lines 128 and conductive vias 130). A back-end layer 172 may also include one or more back-end transistors 132. As shown, one or more back-end transistors 132 may share "layers" in a metallization stack with conductive vias and/or lines (e.g., one or more back-end transistors 132 may be arranged laterally with conductive vias 130 and/or conductive lines 128 in a metallization stack). In some embodiments, a back-end layer 172 may include a storage element (not shown) to which the back-end transistor 132 is coupled; the storage element and the back-end transistor 132 may together act as a memory cell. In some embodiments, the back-end transistor 132 may itself be a memory device (e.g., a 1-transistor (1T) memory device).

The back-end transistor 132 may include a channel 136 and a gate 182, in accordance with various embodiments. The gate 182 may include a gate electrode 140 and a material 138, with the material 138 disposed between the gate electrode 140 and the channel 136.

The channel 136 may be composed of semiconductor material systems including, for example, n-type or p-type materials systems. In some embodiments, the channel 136 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, strontium oxide, or tungsten oxide. In some embodiments, the channel 136 may include indium gallium zinc oxide (IGZO). In some embodiments, the channel 136 may be a single-crystal semiconductor material, such as single-crystal silicon or single-crystal germanium. In some embodiments, the channel 136 may have a bandgap that is greater than 1.3 electron-volts; such embodiments may allow the back-end transistor 132 to exhibit lower leakage in the "off" state, yielding a larger signal-to-noise ratio and thus improved performance. In some embodiments, the channel 136 may include a metal. In some embodiments, the channel 136 may have a thickness between 5 nanometers and 30 nanometers.

The gate electrode 140 may include at least one p-type work function metal or n-type work function metal, depending on whether the back-end transistor 132 is to be a p-type metal oxide semiconductor (PMOS) or an n-type metal oxide semiconductor (NMOS) transistor. In some implementations, the gate electrode 140 may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode 140 include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode 140 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning). In some embodiments, the gate electrode 140 may include a nitride material, such as titanium nitride, tantalum nitride, tungsten nitride, or tantalum carbonitride.

In some embodiments, the material 138 may include a ferroelectric material stack. A back-end transistor 132 including a ferroelectric material stack in the material 138 may exhibit polarization in the ferroelectric material during operation, shifting the current-voltage (I-V) characteristic (e.g., the threshold voltage) of the back-end transistor 132 depending upon the state of the polarization and thus allowing the transistor to be used as a memory device (e.g., a 1T memory device). For example, a "1" or "0" may be written to a 1T memory cell by appropriate control of the gate voltage, and this "1" or "0" may be read back by measuring the source/drain current at a specified gate voltage. In some embodiments, the material 138 may not include a ferroelectric material stack, but may instead be provided by any of the embodiments of the gate dielectric discussed below with reference to the gate dielectric of the transistor 142 of FIG. 9.

The back-end transistor 132 may include source/drain (S/D) regions 134 disposed on the channel 136 such that the S/D regions 134 are not coplanar with the channel 136, but this is simply illustrative and any suitable arrangement of S/D regions 134, channels 136, and gates 182 may be used. The S/D regions 134 may include one or more layers of metal and/or metal alloys, as known for thin film transistors based on semiconductor oxide systems.

FIG. 9 is a side, cross-sectional view of an example front-end layer 174 that may be included in an oscillator stage 108, an inter-stage interconnect 112, and/or peak detector circuitry 106 of a neural computing die 150. The front-end layer 174 may be formed on a substrate 146 (e.g., the wafer 1500 of FIG. 10). The substrate 146 may be a semiconductor substrate composed of semiconductor material systems including, for example, n-type or p-type material systems. The substrate 146 may include, for example, a crystalline substrate formed using a bulk silicon or a silicon-on-insulator substructure. In some embodiments, the substrate 146 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 146. Although a few examples of materials from which the substrate 146 may be formed are described here, any material that may serve as a foundation for a front-end layer 174 may be used. The substrate 146 may be part of a singulated die (e.g., the dies 1502 of FIG. 10) or a wafer (e.g., the wafer 1500 of FIG. 10).

A front-end region 122 of a neural computing die may include one or more front-end layers 174 disposed on substrates 146. A front-end layer 174 may include features of one or more transistors 142 (e.g., metal oxide semiconductor field-effect transistors (MOSFETs)) formed on the substrate 146. The front-end layer 174 may include, for example, one or more S/D regions 152, a gate 154 to control current flow in the channel 148 of the transistors 142 between the S/D regions 152, one or more S/D contacts 158 (which may take the form of conductive vias) to route electrical signals to/from the S/D regions 152, and gate contacts 160 (which may take the form of conductive vias) to route electrical signals to/from the gate 154. Adjacent transistors 142 may be isolated from each other by a shallow trench isolation (STI) insulating material 144, in some embodiments. The transistors 142 may include additional features not depicted for the sake of clarity, such as device isolation regions and the like. The transistors 142 are not limited to the type and configuration depicted in FIG. 9 and may include a wide variety of other types and configurations such as, for example, planar transistors, nonplanar transistors, or a combination of both. Nonplanar transistors may include FinFET transistors, such as double-gate transistors or tri-gate transistors, and wire-based transistors such as wrap-around or all-around gate transistors (e.g., nanoribbon or nanowire transistors).

Each transistor 142 may include a gate 154 including a gate dielectric and a gate electrode. The gate electrode of the transistor 142 may include at least one p-type work function metal or n-type work function metal, depending on whether the transistor 142 is to be a PMOS transistor or an NMOS transistor. For a PMOS transistor, metals that may be used for the gate electrode of the transistor 142 may include, but are not limited to, ruthenium, palladium, platinum, cobalt, nickel, and conductive metal oxides (e.g., ruthenium oxide). For an NMOS transistor, metals that may be used for the gate electrode of the transistor 142 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode of the transistor 142 may consist of a stack of two or more metal layers, where one or more metal layers are work function metal layers and at least one metal layer is a fill metal layer. Further metal layers may be included for other purposes, such as to act as a barrier layer.

The gate dielectric of the transistor 142 may be, for example, silicon oxide, aluminum oxide, or a high-k dielectric, such as hafnium oxide. More generally, the gate dielectric of the transistor 142 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric of the transistor 142 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric of the transistor 142 to improve the quality of the gate dielectric of the transistor 142.

In some embodiments, when viewed as a cross section of the transistor 142 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode of the transistor 142 may simply be a planar layer that is substantially parallel to the top surface of the substrate and does not include sidewall portions substantially perpendicular to the top surface of the substrate. In other embodiments, the gate electrode of the transistor 142 may consist of a combination of U-shaped structures and planar non-U-shaped structures. For example, the gate electrode of the transistor 142 may consist of one or more U-shaped metal layers formed atop one or more planar non-U-shaped layers. In some embodiments, the gate electrode may consist of a V-shaped structure.

In some embodiments, a pair of sidewall spacers 156 may be formed on opposing sides of the gate 154 to bracket the gate 154. The sidewall spacers 156 may be formed from a material such as silicon nitride, silicon oxide, silicon carbide, silicon nitride doped with carbon, and silicon oxynitride. Processes for forming sidewall spacers 156 are well known in the art and generally include deposition and etching process steps. In some embodiments, multiple pairs of sidewall spacers 156 may be used; for instance, two pairs, three pairs, or four pairs of sidewall spacers 156 may be formed on opposing sides of the gate stack.

The S/D regions 152 may be formed within the substrate 146 adjacent to the gate 154 of each transistor 142. For example, the S/D regions 152 may be formed using either an implantation/diffusion process or a deposition process. In the former process, dopants such as boron, aluminum, antimony, phosphorous, or arsenic may be ion-implanted into the substrate 146 to form the S/D regions 152. An annealing process that activates the dopants and causes them to diffuse farther into the substrate 146 may follow the ion-implantation process. In the latter process, an epitaxial deposition process may provide material that is used to fabricate the S/D regions 152. In some implementations, the S/D regions 152 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 152 may be formed using one or more alternate semiconductor materials such as germanium or a group III-V material or alloy. In further embodiments, one or more layers of metal and/or metal alloys may be used to form the S/D regions 152. In some embodiments, an etch process may be performed before the epitaxial deposition to create recesses in the substrate 146 in which the material for the S/D regions 152 is deposited.

Electrical signals, such as power and/or input/output (I/O) signals, may be routed to/from the transistors 142 of the front-end layer 174 (and/or to/from transistors 132 of the back-end layer 172) through one or more interconnect layers (like the interconnect layer 168 discussed above with reference to FIG. 7) disposed on the front-end layer 174. Interconnects, such as the S/D contacts 158 and gate contacts 160 may be referred to as Metal 0 (M0). In some embodiments, a front-end layer 174 may include one or more interconnects that extend through the front-end layer 174; in FIG. 9, this is illustrated as a conductive via 162 in contact with a through-substrate via (TSV) 164. When the substrate 146 includes silicon, the TSV 164 may be referred to as a "through-silicon via". The use of TSVs 164 may allow interconnects to be made to the neural computing die 150 on at opposite faces of the front-end layer 174, which may be particularly valuable in certain settings (e.g., wafer-to-wafer bonding settings).

A neural computing die 150 may include a solder resist material (e.g., polyimide or similar material) and one or more bond pads formed on the interconnect layers (e.g., formed on an input region 120). The bond pads may be electrically coupled with the interconnect structures and may route the electrical signals of the neural computing die 150 to other external devices. For example, solder bonds may be formed on the one or more bond pads to mechanically and/or electrically couple a chip including the neural computing die 150 with another component (e.g., a circuit board). The neural computing die 150 may include other structures to route the electrical signals from the interconnect layers than depicted in other embodiments. For example, the bond pads may be replaced by or may further include other analogous features (e.g., posts) that route electrical signals to external components.

The staged oscillator circuitry 100 and the neural computing dies 150 disclosed herein may be included in any suitable electronic component. FIGS. 10-13 illustrate various examples of apparatuses that may include any of the staged oscillator circuitry 100 and/or the neural computing dies 150 disclosed herein.

Figure 10:
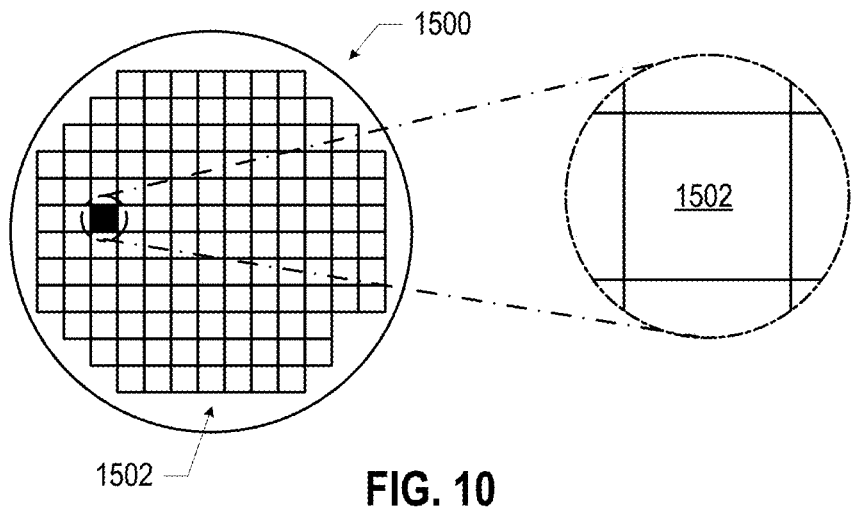
FIG. 10 is a top view of a wafer and dies that may include staged oscillator circuitry, in accordance with any of the embodiments disclosed herein.

FIG. 10 is a top view of a wafer 1500 and dies 1502 that may include the staged oscillator circuitry 100 and/or one or more neural computing dies 150 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be a neural computing die 150, in accordance with any of the embodiments disclosed herein (e.g., may include one or more transistors 142, transistors 132, oscillator stages 108, inter-stage interconnects 112, etc.). In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 11:
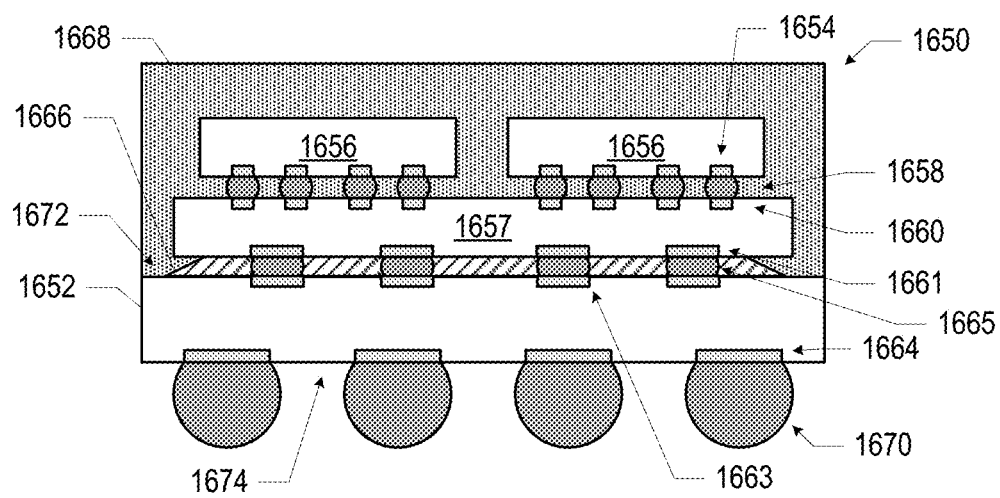
FIG. 11 is a side, cross-sectional view of an integrated circuit (IC) package that may include staged oscillator circuitry, in accordance with various embodiments.

FIG. 11 is a side, cross-sectional view of an example IC package 1650 that may include the staged oscillator circuitry 100 and/or one or more neural computing dies 150. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may include conductive lines and/or conductive vias, arranged as desired.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 11 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 11 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 11 are solder balls (e.g., for a ball grid array arrangement), but any suitable second-level interconnects 1670 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 12.

The dies 1656 may take the form of any of the embodiments of the die 1502 discussed herein (e.g., may include any of the embodiments of the neural computing die 150). In embodiments in which the IC package 1650 includes multiple dies 1656, the IC package 1650 may be referred to as a multi-chip package (MCP). The dies 1656 may include circuitry to perform any desired functionality. For example, one or more of the dies 1656 may be logic dies (e.g., silicon-based dies), and one or more of the dies 1656 may be memory dies (e.g., high bandwidth memory). In some embodiments, a die 1656 may be a neural computing die 150, in accordance with any of the embodiments disclosed herein Although the IC package 1650 illustrated in FIG. 11 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 11, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 12:
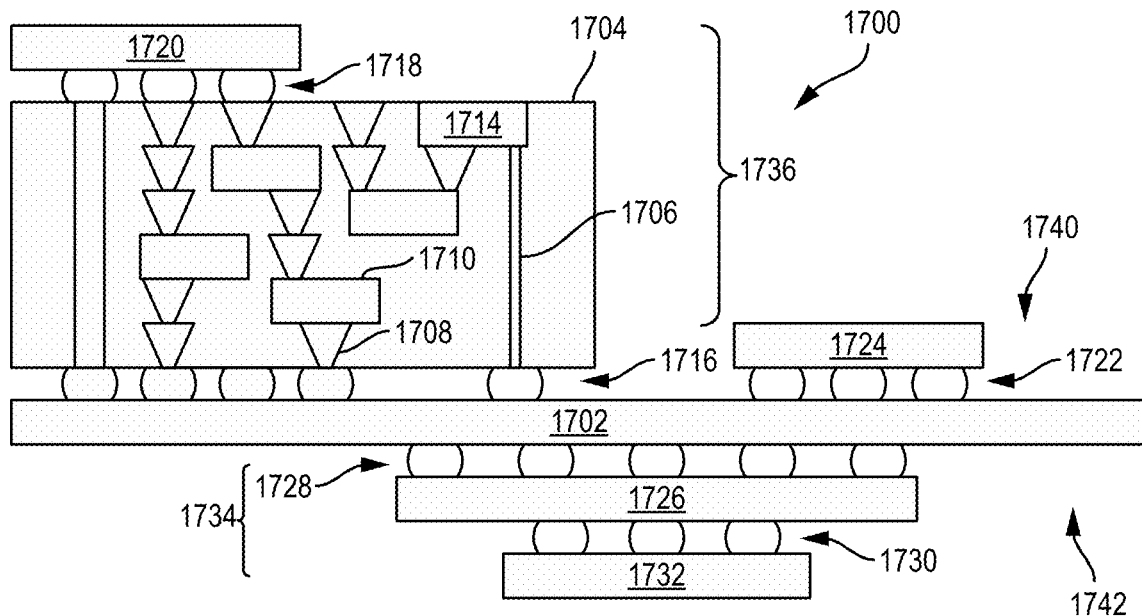
FIG. 12 is a side, cross-sectional view of an IC device assembly that may include staged oscillator circuitry, in accordance with any of the embodiments disclosed herein.

FIG. 12 is a side, cross-sectional view of an IC device assembly 1700 that may include one or more IC packages or other electronic components (e.g., a die) including the staged oscillator circuitry 100 and/or one or more neural computing dies 150 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 11 (e.g., may include one or more neural computing dies 150).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 10, such as a neural computing die 150) or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 12, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
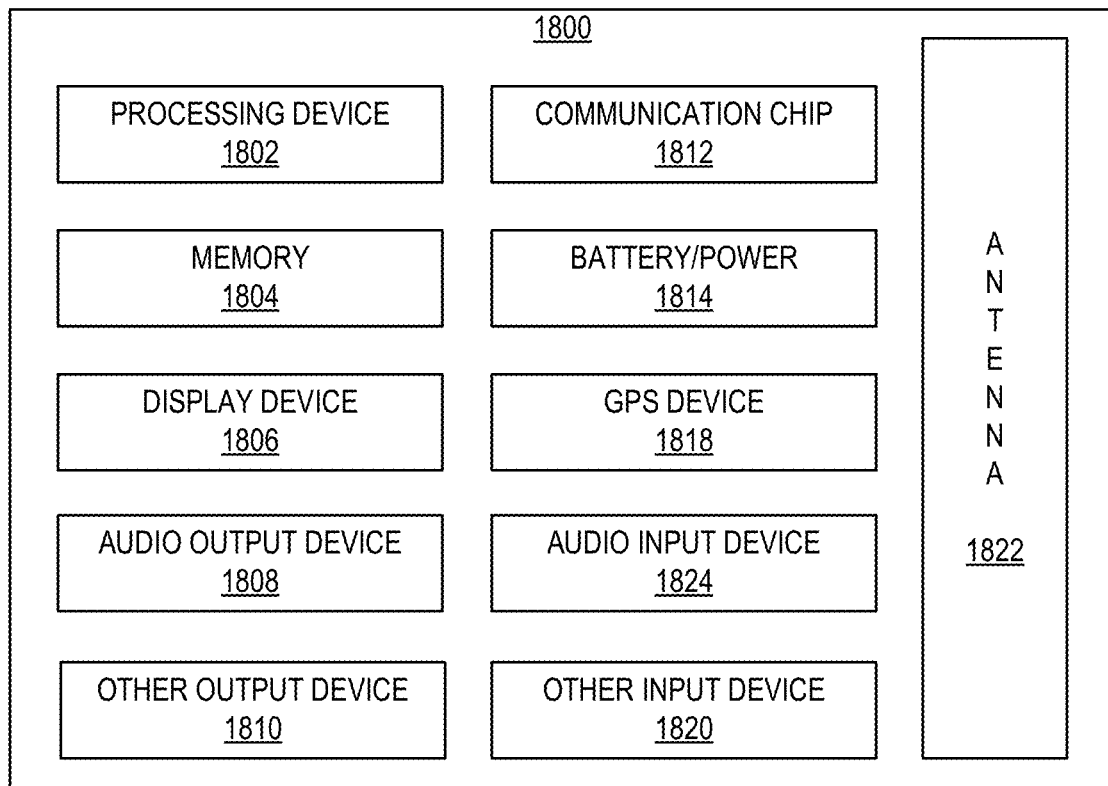
FIG. 13 is a block diagram of an example electrical device that may include staged oscillator circuitry, in accordance with any of the embodiments disclosed herein.

FIG. 13 is a block diagram of an example electrical device 1800 that may include the staged oscillator circuitry 100 and/or one or more neural computing dies 150 in accordance with any of the embodiments disclosed herein. For example, any suitable ones of the components of the electrical device 1800 may include one or more of the IC device assemblies 1700, IC packages 1650, or dies 1502 disclosed herein. A number of components are illustrated in FIG. 13 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 13, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some particular embodiments, the processing device 1802 may include one or more vision processing units (VPUs) or other artificial intelligence (AI)- or neural network (NN)-specific processing devices; any of these processing devices 1802 may include any of the staged oscillator circuitry 100 and/or the neural computing dies 150 disclosed herein. In some embodiments, the staged oscillator circuitry and/or the neural computing dies 150 disclosed herein may be included in a single system-on-chip (SoC), which may include one or more CPUs, GPUs, VPUs, other AI/NN-specific processing units; such embodiments may be particularly useful in a mobile or handheld computing device. The electrical device 1800 may include a memory 1804, which may itself include one or more memory devices such as volatile memory (e.g., dynamic RAM (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded DRAM (eDRAM) or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein. Example 1 is neural computing circuitry, including: a first oscillator set; a second oscillator set; and an averaging structure coupled between the first oscillator set and the second oscillator set.

Example 2 includes the subject matter of Example 1, and further specifies that an output of the averaging structure is coupled to an input of an oscillator in the second oscillator set.

Example 3 includes the subject matter of any of Examples 1-2, and further specifies that an output of an oscillator in the first oscillator set is coupled to an input of the averaging structure.

Example 4 includes the subject matter of any of Examples 1-3, and further specifies that outputs of a plurality of oscillators in the first oscillator set are coupled to an input of the averaging structure.

Example 5 includes the subject matter of any of Examples 1-4, and further specifies that the first oscillator set includes at least 16 oscillators.

Example 6 includes the subject matter of any of Examples 1-5, and further specifies that the first oscillator set includes at least 32 oscillators.

Example 7 includes the subject matter of any of Examples 1-6, and further specifies that the first oscillator set includes at least one ring oscillator.

Example 8 includes the subject matter of any of Examples 1-7, and further specifies that the second oscillator set includes at least one ring oscillator.

Example 9 includes the subject matter of any of Examples 1-8, and further specifies that the averaging structure includes a metal plane.

Example 10 includes the subject matter of any of Examples 1-9, and further specifies that the first oscillator set includes at least one back-end transistor.

Example 11 includes the subject matter of any of Examples 1-10, and further specifies that the first oscillator set includes at least one front-end transistor.

Example 12 includes the subject matter of any of Examples 1-11, and further specifies that the second oscillator set includes at least one back-end transistor.

Example 13 includes the subject matter of any of Examples 1-12, and further specifies that the second oscillator set includes at least one front-end transistor.

Example 14 includes the subject matter of any of Examples 1-13, and further specifies that the averaging structure is a first averaging structure, and the neural computing circuitry further includes: a second averaging structure, wherein the second oscillator set is coupled between the first averaging structure and the second averaging structure.

Example 15 includes the subject matter of Example 14, and further specifies that an output of an oscillator in the second oscillator set is coupled to an input of the second averaging structure.

Example 16 includes the subject matter of any of Examples 14-15, and further specifies that outputs of a plurality of oscillators in the second oscillator set are coupled to an input of the second averaging structure.

Example 17 includes the subject matter of any of Examples 14-16, and further specifies that the second oscillator set includes at least 16 oscillators.

Example 18 includes the subject matter of any of Examples 14-17, and further specifies that the second oscillator set includes at least 32 oscillators.

Example 19 includes the subject matter of any of Examples 14-18, and further specifies that the second averaging structure includes a metal plane.

Example 20 includes the subject matter of any of Examples 14-19, and further includes: peak detector circuitry, wherein the second averaging structure is coupled between the second oscillator set and the peak detector circuitry.

Example 21 includes the subject matter of Example 20, and further specifies that the peak detector circuitry includes at least one back-end transistor.

Example 22 includes the subject matter of any of Examples 20-21, and further specifies that the peak detector circuitry includes at least one front-end transistor.

Example 23 includes the subject matter of any of Examples 20-22, and further specifies that the neural computing circuitry does not include additional peak detector circuitry between the peak detector circuitry and the first oscillator set.

Example 24 includes the subject matter of any of Examples 1-23, and further includes: peak detector circuitry, wherein the second oscillator set is coupled between the first oscillator set and the peak detector circuitry.

Example 25 includes the subject matter of Example 24, and further specifies that the peak detector circuitry includes at least one back-end transistor.

Example 26 includes the subject matter of any of Examples 24-25, and further specifies that the peak detector circuitry includes at least one front-end transistor.

Example 27 includes the subject matter of any of Examples 24-26, and further specifies that the neural computing circuitry does not include additional peak detector circuitry between the peak detector circuitry and the first oscillator set.

Example 28 includes the subject matter of any of Examples 1-27, and further specifies that the averaging structure is a first averaging structure, and the neural computing circuitry further includes: a third oscillator set; and a second averaging structure coupled between the third oscillator set and the second oscillator set.

Example 29 includes the subject matter of Example 28, and further specifies that an output of the second averaging structure is coupled to an input of an oscillator in the second oscillator set.

Example 30 includes the subject matter of any of Examples 28-29, and further specifies that an output of an oscillator in the third oscillator set is coupled to an input of the second averaging structure.

Example 31 includes the subject matter of any of Examples 28-30, and further specifies that outputs of a plurality of oscillators in the third oscillator set are coupled to an input of the second averaging structure.

Example 32 includes the subject matter of any of Examples 28-31, and further specifies that the third oscillator set includes at least 16 oscillators.

Example 33 includes the subject matter of any of Examples 28-32, and further specifies that the third oscillator set includes at least 32 oscillators.

Example 34 includes the subject matter of any of Examples 28-33, and further specifies that the third oscillator set includes at least one ring oscillator.

Example 35 includes the subject matter of any of Examples 28-34, and further specifies that the second averaging structure includes a metal plane.

Example 36 includes the subject matter of any of Examples 28-35, and further specifies that the third oscillator set includes at least one back-end transistor.

Example 37 includes the subject matter of any of Examples 28-36, and further specifies that the third oscillator set includes at least one front-end transistor.

Example 38 includes the subject matter of any of Examples 28-37, and further specifies that an output of the first averaging structure is coupled to an input of a first oscillator in the second oscillator set, and an output of the second averaging structure is coupled to an input of a second oscillator, different from the first oscillator, in the second oscillator set.

Example 39 includes the subject matter of any of Examples 28-38, and further specifies that a coupling between the second averaging structure and the second oscillator set is a unidirectional coupling.

Example 40 includes the subject matter of any of Examples 28-39, and further specifies that a coupling between the second averaging structure and the second oscillator set is an injection-locked coupling.

Example 41 includes the subject matter of any of Examples 1-40, and further specifies that a coupling between the averaging structure and the second oscillator set is a unidirectional coupling.

Example 42 includes the subject matter of any of Examples 1-41, and further specifies that a coupling between the averaging structure and the second oscillator set is an injection-locked coupling.

Example 43 includes the subject matter of any of Examples 1-42, and further specifies that the neural computing circuitry is included in a die.

Example 44 includes the subject matter of any of Examples 1-43, and further specifies that the neural computing circuitry is included in one or more dies.

Example 45 is neural computing circuitry, including: a plurality of first oscillators; a second oscillator; and an averaging structure, wherein outputs of the plurality of first oscillators are coupled to an input of the averaging structure, and an output of the averaging structure is coupled to an input of the second oscillator.

Example 46 includes the subject matter of Example 45, and further specifies that the plurality of first oscillators includes at least 16 oscillators.

Example 47 includes the subject matter of any of Examples 45-46, and further specifies that the plurality of first oscillators includes at least 32 oscillators.

Example 48 includes the subject matter of any of Examples 45-47, and further specifies that the plurality of first oscillators includes at least one ring oscillator.

Example 49 includes the subject matter of any of Examples 45-48, and further specifies that the second oscillator includes a ring oscillator.

Example 50 includes the subject matter of any of Examples 45-49, and further specifies that the averaging structure includes a metal plane.

Example 51 includes the subject matter of any of Examples 45-50, and further specifies that the plurality of first oscillators includes at least one back-end transistor.

Example 52 includes the subject matter of any of Examples 45-51, and further specifies that plurality of first oscillators includes at least one front-end transistor.

Example 53 includes the subject matter of any of Examples 45-52, and further specifies that the second oscillator includes at least one back-end transistor.

Example 54 includes the subject matter of any of Examples 45-53, and further specifies that the second oscillator includes at least one front-end transistor.

Example 55 includes the subject matter of any of Examples 45-54, and further specifies that the averaging structure is a first averaging structure, and the neural computing circuitry further includes: a second averaging structure, wherein an output of the second oscillator is coupled to an input of the second averaging structure.

Example 56 includes the subject matter of Example 55, and further specifies that the second oscillator is one of a plurality of second oscillators, and outputs of the plurality of second oscillators are coupled to an input of the second averaging structure.

Example 57 includes the subject matter of any of Examples 55-56, and further specifies that the plurality of second oscillators includes at least 16 oscillators.

Example 58 includes the subject matter of any of Examples 55-57, and further specifies that the plurality of second oscillators includes at least 32 oscillators.

Example 59 includes the subject matter of any of Examples 55-58, and further specifies that the second averaging structure includes a metal plane.

Example 60 includes the subject matter of any of Examples 55-59, and further includes: peak detector circuitry, wherein the second averaging structure is coupled between the first averaging structure and the peak detector circuitry.

Example 61 includes the subject matter of Example 60, and further specifies that the peak detector circuitry includes at least one back-end transistor.

Example 62 includes the subject matter of any of Examples 60-61, and further specifies that the peak detector circuitry includes at least one front-end transistor.

Example 63 includes the subject matter of any of Examples 60-62, and further specifies that the neural computing circuitry does not include additional peak detector circuitry between the peak detector circuitry and the first averaging structure.

Example 64 includes the subject matter of any of Examples 55-63, and further includes: a plurality of third oscillators; a fourth oscillator; and a third averaging structure, wherein outputs of the plurality of third oscillators are coupled to an input of the third averaging structure, an output of the second averaging structure is coupled to an input of the fourth oscillator, and an output of the fourth oscillator is coupled to the input of the second averaging structure.

Example 65 includes the subject matter of any of Examples 45-64, and further includes: peak detector circuitry, wherein the second oscillator is coupled between the averaging structure and the peak detector circuitry.

Example 66 includes the subject matter of Example 65, and further specifies that the peak detector circuitry includes at least one back-end transistor.

Example 67 includes the subject matter of any of Examples 65-66, and further specifies that the peak detector circuitry includes at least one front-end transistor.

Example 68 includes the subject matter of any of Examples 65-67, and further specifies that the neural computing circuitry does not include additional peak detector circuitry between the peak detector circuitry and the plurality of first oscillators.

Example 69 includes the subject matter of any of Examples 45-68, and further specifies that the averaging structure is a first averaging structure, and the neural computing circuitry further includes: a plurality of third oscillators; a fourth oscillator; and a second averaging structure, wherein outputs of the plurality of third oscillators are coupled to an input of the second averaging structure, and an output of the second averaging structure is coupled to an input of the fourth oscillator.

Example 70 includes the subject matter of any of Examples 45-69, and further specifies that a coupling between the averaging structure and the second oscillator is a unidirectional coupling.

Example 71 includes the subject matter of any of Examples 45-70, and further specifies that a coupling between the averaging structure and the second oscillator is an injection-locked coupling.

Example 72 includes the subject matter of any of Examples 45-71, and further specifies that the neural computing circuitry is included in a die.

Example 73 includes the subject matter of any of Examples 45-72, and further specifies that the neural computing circuitry is included in one or more dies.

Example 74 is a neural computing system, including: one or more dies including neural computing circuitry, wherein the neural computing circuitry includes a first oscillator, a second oscillator, and an averaging structure coupled between the first oscillator and the second oscillator; and a support component coupled to the one or more dies.

Example 75 includes the subject matter of Example 74, and further specifies that an output of the averaging structure is coupled to an input of the second oscillator.

Example 76 includes the subject matter of any of Examples 74-75, and further specifies that an output of the first oscillator is coupled to an input of the averaging structure.

Example 77 includes the subject matter of any of Examples 74-76, and further specifies that the first oscillator is one of a plurality of first oscillators, and outputs of the plurality of first oscillators are coupled to an input of the averaging structure.

Example 78 includes the subject matter of Example 77, and further specifies that the plurality of first oscillators includes at least 16 oscillators.

Example 79 includes the subject matter of any of Examples 77-78, and further specifies that the plurality of first oscillators includes at least 32 oscillators.

Example 80 includes the subject matter of any of Examples 74-79, and further specifies that the first oscillator includes a ring oscillator.

Example 81 includes the subject matter of any of Examples 74-80, and further specifies that the second oscillator includes a ring oscillator.

Example 82 includes the subject matter of any of Examples 74-81, and further specifies that the averaging structure includes a metal plane.

Example 83 includes the subject matter of any of Examples 74-82, and further specifies that the first oscillator includes at least one back-end transistor.

Example 84 includes the subject matter of any of Examples 74-83, and further specifies that the first oscillator includes at least one front-end transistor.

Example 85 includes the subject matter of any of Examples 74-84, and further specifies that the second oscillator includes at least one back-end transistor.

Example 86 includes the subject matter of any of Examples 74-85, and further specifies that the second oscillator includes at least one front-end transistor.

Example 87 includes the subject matter of any of Examples 74-86, and further specifies that the averaging structure is a first averaging structure, and the neural computing circuitry further includes: a second averaging structure, wherein the second oscillator is coupled between the first averaging structure and the second averaging structure.

Example 88 includes the subject matter of Example 87, and further specifies that an output of the second oscillator is coupled to an input of the second averaging structure.

Example 89 includes the subject matter of any of Examples 87-88, and further specifies that the second oscillator is one of a plurality of second oscillators, and outputs of the plurality of second oscillators are coupled to an input of the second averaging structure.

Example 90 includes the subject matter of Example 89, and further specifies that the plurality of second oscillators includes at least 16 oscillators.

Example 91 includes the subject matter of any of Examples 89-90, and further specifies that the plurality of second oscillators includes at least 32 oscillators.

Example 92 includes the subject matter of any of Examples 87-91, and further specifies that the second averaging structure includes a metal plane.

Example 93 includes the subject matter of any of Examples 87-82, and further includes: peak detector circuitry, wherein the second averaging structure is coupled between the first averaging structure and the peak detector circuitry.

Example 94 includes the subject matter of Example 93, and further specifies that the peak detector circuitry includes at least one back-end transistor.

Example 95 includes the subject matter of any of Examples 93-94, and further specifies that the peak detector circuitry includes at least one front-end transistor.

Example 96 includes the subject matter of any of Examples 83-95, and further specifies that the neural computing circuitry does not include additional peak detector circuitry between the peak detector circuitry and the first oscillator.

Example 97 includes the subject matter of any of Examples 74-96, and further includes: peak detector circuitry, wherein the second oscillator is coupled between the first oscillator and the peak detector circuitry.

Example 98 includes the subject matter of Example 97, and further specifies that the peak detector circuitry includes at least one back-end transistor.

Example 99 includes the subject matter of any of Examples 97-98, and further specifies that the peak detector circuitry includes at least one front-end transistor.

Example 100 includes the subject matter of any of Examples 97-99, and further specifies that the neural computing circuitry does not include additional peak detector circuitry between the peak detector circuitry and the first oscillator.

Example 101 includes the subject matter of any of Examples 74-100, and further specifies that the averaging structure is a first averaging structure, and the neural computing circuitry further includes: a third oscillator; and a second averaging structure coupled between the third oscillator and the second oscillator.

Example 102 includes the subject matter of Example 101, and further specifies that an output of the second averaging structure is coupled to an input of the second oscillator.

Example 103 includes the subject matter of any of Examples 101-102, and further specifies that an output of the third oscillator is coupled to an input of the second averaging structure.

Example 104 includes the subject matter of any of Examples 101-103, and further specifies that the third oscillator is one of a plurality of third oscillators, and outputs of the plurality of third oscillators are coupled to an input of the second averaging structure.

Example 105 includes the subject matter of Example 104, and further specifies that the plurality of third oscillators includes at least 16 oscillators.

Example 106 includes the subject matter of any of Examples 104-105, and further specifies that the plurality of third oscillators includes at least 32 oscillators.

Example 107 includes the subject matter of any of Examples 101-106, and further specifies that the third oscillator includes a ring oscillator.

Example 108 includes the subject matter of any of Examples 101-107, and further specifies that the second averaging structure includes a metal plane.

Example 109 includes the subject matter of any of Examples 101-108, and further specifies that the third oscillator includes at least one back-end transistor.

Example 110 includes the subject matter of any of Examples 101-109, and further specifies that the third oscillator includes at least one front-end transistor.

Example 111 includes the subject matter of any of Examples 74-110, and further specifies that a coupling between the averaging structure and the second oscillator is a unidirectional coupling.

Example 112 includes the subject matter of any of Examples 74-111, and further specifies that a coupling between the averaging structure and the second oscillator is an injection-locked coupling.

Example 113 includes the subject matter of any of Examples 74-112, and further specifies that the neural computing circuitry is included in a die.

Example 114 includes the subject matter of any of Examples 74-113, and further specifies that the neural computing circuitry is included in one or more dies.

Example 115 includes the subject matter of any of Examples 74-114, and further specifies that the support component includes a package substrate.

Example 116 includes the subject matter of any of Examples 74-115, and further specifies that the support component includes an interposer.

Example 117 includes the subject matter of any of Examples 74-116, and further specifies that the support component includes a circuit board.

Example 118 includes the subject matter of any of Examples 117, and further specifies that the circuit board is a motherboard.

Example 119 includes the subject matter of any of Examples 74-118, and further specifies that the one or more dies are coupled to the support component by solder.

Example 120 is a method of manufacturing neural computing circuitry, including: providing a first oscillator set; providing a second oscillator set; and providing an averaging structure, wherein the averaging structure is electrically coupled between the first oscillator set and the second oscillator set.

Example 121 is a method of operating neural computing circuitry, including: providing an input to a first oscillator set; receiving an output from a peak detector, wherein the output from the peak detector represents peak detection of the output of a first averaging structure whose inputs include the outputs from a second oscillator set, different from the first oscillator set, and wherein a second averaging structure is coupled between the first oscillator set and the second oscillator set.

Example 122 includes the subject matter of Example 121, and further specifies that the input is representative of an image.

The invention claimed is:

1. Neural computing circuitry, comprising:
   a first oscillator set;
   a second oscillator set;
   a first averaging structure coupled between the first oscillator set and the second oscillator set, wherein an output of a first oscillator in the first oscillator set is coupled to an input of the first averaging structure, and the first averaging structure is to injection lock to the second oscillator set;
   peak detector circuitry comprising a transistor that is a back-end transistor; and
   a second averaging structure coupled between the second oscillator set and the peak detector circuitry, wherein an output of a second oscillator in the second oscillator set is coupled to an input of the second averaging structure.

2. The neural computing circuitry of claim 1, wherein an output of the first averaging structure is coupled to an input of the second oscillator in the second oscillator set.

3. The neural computing circuitry of claim 1, wherein the first oscillator is one of a plurality of oscillators in the first oscillator set, and outputs of the plurality of oscillators in the first oscillator set are coupled to an input of the first averaging structure.

4. The neural computing circuitry of claim 1, wherein the first oscillator set includes at least one ring oscillator.

5. The neural computing circuitry of claim 1, wherein the first averaging structure or the second averaging structure includes a metal plane.

6. The neural computing circuitry of claim 1, wherein the first oscillator set or the first averaging structure includes at least one front-end transistor.

7. The neural computing circuitry of claim 1, wherein the second oscillator set or the second averaging structure includes at least one front-end transistor.

8. Neural computing circuitry, comprising:
   a first oscillator;
   a second oscillator;
   a first averaging structure, wherein an output of the first oscillator is coupled to an input of the first averaging structure, and an output of the first averaging structure is coupled to an input of the second oscillator;
   peak detector circuitry comprising a transistor that is a front-end transistor; and
   a second averaging structure coupled between the second oscillator and the peak detector circuitry, wherein an output of the second oscillator is coupled to an input of the second averaging structure.

9. The neural computing circuitry of claim 8, wherein the second oscillator is one of a plurality of second oscillators, and outputs of the plurality of second oscillators are coupled to an input of the second averaging structure.

10. The neural computing circuitry of claim 8, wherein the first oscillator or the first averaging structure includes at least one back-end transistor.

11. The neural computing circuitry of claim 8, wherein the neural computing circuitry does not include additional peak detector circuitry between the peak detector circuitry and the first averaging structure.

12. A neural computing system, comprising:
   one or more dies including neural computing circuitry, wherein the neural computing circuitry includes:
      a first oscillator,
      a second oscillator, and
      a first averaging structure coupled between the first oscillator and the second oscillator,
      peak detector circuitry comprising a transistor that is a front-end transistor or a back-end transistor, and
      a second averaging structure coupled between the second oscillator and the peak detector circuitry; and
   a support component coupled to the one or more dies.

13. The neural computing system of claim 12, wherein a coupling between the first averaging structure and the second oscillator is a unidirectional coupling.

14. The neural computing system of claim 12, wherein a coupling between the first averaging structure and the second oscillator is an injection-locked coupling.

15. The neural computing system of claim 12, wherein the support component includes a package substrate.

16. The neural computing circuitry of claim 1, wherein the second oscillator is one of a plurality of oscillators in the second oscillator set, and outputs of the plurality of oscillators in the second oscillator set are coupled to an input of the second averaging structure.

17. The neural computing circuitry of claim 1, wherein a coupling between the first averaging structure and the second oscillator is a unidirectional coupling.

18. The neural computing circuitry of claim 1, wherein a coupling between the second averaging structure and the peak detector is a unidirectional coupling.

19. The neural computing circuitry of claim 8, wherein the second oscillator or the second averaging structure includes at least one back-end transistor.

20. The neural computing circuitry of claim 8, wherein a coupling between the first averaging structure and the second oscillator is a unidirectional coupling.

* * * * *